US006757862B1

(12) United States Patent
Marianetti, II

(10) Patent No.: US 6,757,862 B1
(45) Date of Patent: Jun. 29, 2004

(54) METHOD AND APPARATUS FOR DIGITAL DATA ERROR CORRECTION CODING

(75) Inventor: Ronald Marianetti, II, Morgan Hill, CA (US)

(73) Assignee: Handspring, Inc., Mountain View, CA (US)

(*) Notice: Subject to any disclaimer, the term of this patent is extended or adjusted under 35 U.S.C. 154(b) by 754 days.

(21) Appl. No.: 09/643,034

(22) Filed: Aug. 21, 2000

(51) Int. Cl.[7] .............................................. H03M 13/00
(52) U.S. Cl. ..................................... 714/774; 714/759
(58) Field of Search ................................ 714/762, 767, 714/760, 752, 774, 759; 369/59; 360/48

(56) References Cited

U.S. PATENT DOCUMENTS

| | | | | |
|---|---|---|---|---|
| 4,359,772 A | * | 11/1982 | Patel | 714/762 |
| 4,791,622 A | * | 12/1988 | Clay et al. | 369/59 |
| 5,111,463 A | * | 5/1992 | Zook | 714/762 |
| 5,263,030 A | * | 11/1993 | Rotker et al. | 714/762 |
| 5,392,289 A | * | 2/1995 | Varian | 714/707 |
| 5,457,702 A | * | 10/1995 | Williams et al. | 714/760 |
| 6,317,855 B1 | * | 11/2001 | Horibe | 714/752 |
| 6,449,111 B1 | * | 9/2002 | Kool et al. | 360/48 |

* cited by examiner

Primary Examiner—David Ton
(74) Attorney, Agent, or Firm—Stattler Johansen & Adeli LLP

(57) ABSTRACT

A method for generating an error correction code (ECC) for a sequence of data units. A first lookup table has first mask words representing a correspondence between each possible data unit sequence position and bit modifications for the ECC. A second lookup table is provided having second mask words representing a correspondence between each possible data unit value and bit modifications for the ECC. For each data unit, the ECC is modified utilizing the first and second lookup tables. The parity of the data unit is determined and, if the parity of the given data unit is of a first value, a first mask word is obtained from the first lookup table corresponding to the given data unit sequence position, and used to modify the ECC. The ECC is modified using a second mask word obtained from the second lookup table.

29 Claims, 4 Drawing Sheets

METHOD AND APPARATUS FOR DIGITAL DATA ERROR CORRECTION CODING

FIELD OF THE INVENTION

This invention relates to a method and apparatus for error correction coding of digital data. The invention has application, for example, in data storage and retrieval systems such as disk drives and flash memory.

BACKGROUND OF THE INVENTION

In digital data storage and retrieval systems such as disk drives and flash memory systems it is common to include error detection and correction capabilities, for example utilizing an error correction code (ECC) or the like. Such error detection and correction provides a degree of fault tolerance for the data storage and retrieval system, which is particularly useful where increasing operating speeds and storage densities can in some circumstances increase the rate likelihood of data reading and/or writing errors.

One way of providing an error detection and correction capability involves arranging the digital data into data blocks and generating a code (e.g. an ECC) for each block from the data in that block. The code is generated so that a change to the data in the data block will result in a different code value if a subsequent code is generated from the changed data. A first code value is generated from the data prior to an operation such as writing the data to storage, and a second code value is generated from the data when it is read from the storage, for example. A comparison of the first and second code values will then indicate whether any change to the data had occurred during the writing/storage/reading operation. Typically the first code is stored along with the data block so it is available for comparison with the second code value generated from the retrieved data. A difference between the first and second code values indicates that an error has occurred during the operation(s) carried out between the generation of the two code values, and the error has resulted in an alteration to the data in the data block.

Many error detection systems use coding which is generated from the parity of the data in the data block, and portions thereof Preferably the code is generated and structured to also allow correction of certain types of errors, which is an error correction code (ECC), rather than simply an error detection code. An ECC typically enables detection of an error in a data block, and in the case of a single bit error (SBE) identification of the position of the erroneous bit in the block. Therefore, if a single bit error occurs, the use of a typical ECC enables detection of the error and the position thereof, allowing the erroneous bit to be corrected (toggled). It is possible to provide error correction coding to allow for correction of multiple bit errors, however for most applications the computational and storage overhead for such coding is considered unnecessary.

In addition to computational and storage overhead, another consideration for optimal error correction coding is the time required to generate and compare the codes at the time of reading the data. Commonly used ECC systems require the entire data block to be retrieved before the ECC generating algorithm can be initiated. In this case, the entire time required to generate and check the ECC must be added to the data retrieval time before the data block is available for use. It is preferable if the ECC can be generated whilst the data of the data block is being retrieved, particularly in the case of data retrieval systems which are serial in nature.

SUMMARY OF THE INVENTION

In accordance with the principles of the present invention, there is provided a method for determining an error correction code for a block of digital data comprising a sequence of data units. The method first initializes the error correction code and then, for each data unit in the sequence, performs first and second operations on the error correction code according to the value of the data unit and the sequence position of the data unit.

The error correction code determination method builds the error correction code using one data unit (e.g. one byte) at a time from the data block, and is therefore adapted for use with systems in which the data block may be supplied serially.

The first and second operations can be performed with the use of pre-generated lookup tables. The lookup tables are adapted for the size of data unit and sequence length of the data block.

In one form of the invention, the first operation comprises determining whether a given data unit value has an odd or even parity and, according to the parity determination, modifying the error correction code using a first mask word determined according to the sequence position of the given data unit. The first mask word can be obtained from a first predetermined lookup table using the sequence position of the given data unit.

The second operation may comprise modifying the error correction code using a second mask word obtained from a second predetermined lookup table according to the value of the given data unit.

Preferably the error correction code is modified using exclusive-OR operations with the first and second mask words.

Preferably the parity of the given data unit value is determined using a third predetermined lookup table.

In a preferred form of the invention, the first operation comprises determining the parity of the given data unit using the third lookup table and, if the given data unit parity is of a first value, obtaining a first mask word from the first predetermined lookup table corresponding to the given data unit sequence position, and modifying the error correction code by performing an exclusive-OR operation with the first mask word.

The present invention also provides an error correction code generator for generating an error correction code for a data block comprising a sequence of data units. The error correction code generator includes a first stored lookup table having first mask words representing a correspondence between each possible data unit sequence position of the data block and bit modifications for the error correction code. The error correction code generator also includes a second stored lookup table having second mask words representing a correspondence between each possible data unit value and bit modifications for the error correction code. The error correction code generator further includes a data processor coupled to access the first and second lookup tables and coupled to receive the sequence of data units comprising the data block. The data processor is operative to initialize the error correction code and, for each data unit in the data block sequence, modify the error correction code utilizing the first and second lookup tables.

Preferably, for each data unit in the data block sequence, the data processor determines the parity of the data unit and, if the given data unit parity is of a first value, obtains a first mask word from the first stored lookup table corresponding to the given data unit sequence position, and modifies the error correction code by performing an exclusive-OR operation with the first mask word.

The error correction code generator preferably also includes a third stored lookup table comprising a correspondence between parity values and each possible data unit value, the data processor being coupled to access the third stored lookup table, wherein the data processor determines the parity of each data unit of the data block by consulting the third lookup table using the value of the data unit.

Preferably, for each data unit in the data block sequence, the data processor obtains a second mask word from the second stored lookup table, and modifies the error correction code by performing an exclusive-OR operation with the second mask word.

The present invention further provides a method for generating an error correction code for a data block comprising a sequence of data units, the method comprising:

initializing the error correction code; and for each data unit in the data block sequence:

performing a first modification to the error correction code utilizing a first stored lookup table having first mask words representing a correspondence between each possible data unit sequence position of the data block and bit modifications for the error correction code; and performing a second modification to the error correction code utilizing a second stored lookup table having second mask words representing a correspondence between each possible data unit value and bit modifications for the error correction code.

Preferably the first and second modifications of the error correction code comprise exclusive-OR operations between the error correction code and the first and second mask words, respectively.

A method for error correction of a data block comprising a sequence of data units is also provided. The error correction method includes generating a first error correction code according to the method of the invention described hereinabove, and generating a second error correction code according to the method of the invention. The first and second error correction codes may be generated before and after a data storage and retrieval process, for example. The first and second error correction codes are then compared using an exclusive-OR operation, and a number of bits mismatched in the comparison is determined. If a predetermined number of bits mismatch, then an error is corrected by toggling a bit in the data block on the basis of the mismatched bits of the error correction code comparison.

BRIEF DESCRIPTION OF THE DRAWINGS

The invention is described in greater detail hereinafter, by way of example only, through description of a preferred embodiment thereof and with reference to the accompanying drawings in which.

DETAILED DESCRIPTION OF THE PREFERRED EMBODIMENTS

Figure 1:
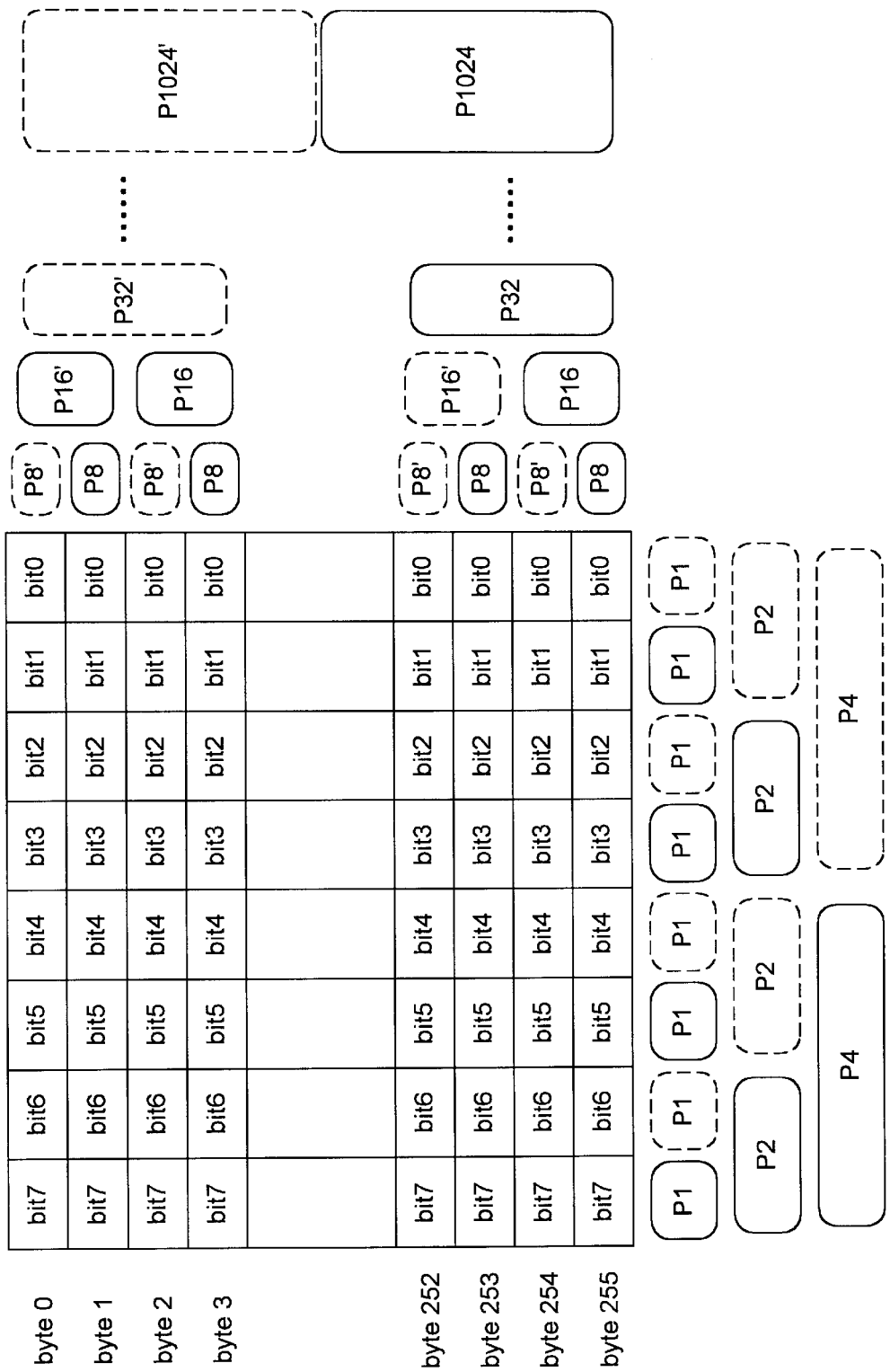
FIG. 1 is a diagrammatic representation of the generation of an error correction code according to a prior art technique.

A method and apparatus for digital data error correction coding is disclosed herein. In the following description, for purposes of explanation, specific nomenclature and specific implementation details are set forth to provide a thorough understanding of the present invention. However, it will be apparent to one skilled in the art that these specific details are not required in order to practice the present invention. For example, the preferred embodiment is described in the context of data storage and retrieval systems, but the inventive techniques are equally applicable to other data systems such as data transmission. Also, the present invention is explained primarily in terms of a specific sized data block and bit array, but those of ordinary skill in the art will recognize that other data arrangements can alternatively be employed.

It will of course be understood by those skilled in the art that the preferred methods of the present invention involve manipulation of digital data using computer data processing apparatus. In that context, some steps and data structures refer to "arrays", "tables" and the like, but it will be appreciated that a data table for example will not be physically arranged in tabular form and is instead a notional computer representation of a tabular form in which the properties thereof can be exploited.

By way of additional background, a particular prior art error correction code generation method will be described with reference to FIGS. 1, 2 and 3. In the prior art ECC generation method the ECC comprises 3 bytes for each 256 byte data block, although only 22 bits are used for the code. The 22 bit ECC comprises 16 bits allocated for line parity values from the data block and 6 bits allocated for column parity values. Table 1, below, indicates the arrangement of the data block, where each bit in the data block is allocated an offset address designated by D(yyyyyyyy,xxx) with yyyyyyyy being the binary row address (1 of 256) and xxx being the bit address within each byte (1 of 8).

TABLE 1

| I/O 7 | I/O 6 | | I/O 1 | I/O 0 | |
|---|---|---|---|---|---|
| D(00000000,111) | D(00000000,110) | | D(00000000,001) | D(00000000,000) | Byte 0 |
| D(00000001,111) | D(00000001,110) | | D(00000001,001) | D(00000001,000) | Byte 1 |
| D(00000010,111) | D(00000010,110) | | D(00000010,001) | D(00000010,000) | Byte 2 |
| | | ... | | | |
| D(11111110,111) | D(11111110,110) | | D(11111110,001) | D(11111110,000) | Byte 254 |
| D(11111111,111) | D(11111111,110) | | D(11111111,001) | D(11111111,000) | Byte 255 |

FIG. 1 of the drawings illustrates how the bits in the data block are used to form the parity bits that make of the error correction code word. The ECC word has 16 line parity bits:

P1024, P1024', P512, P512', P256 . . . P16', P8, P8' and six column parity bits:

P4, P4', P2, P2', P1, P1'

The parity bits of the ECC are arranged as shown in the ECC code assignment table shown in Table 2 below.

TABLE 2

| I/O 7 | I/O 6 | I/O 5 | I/O 4 | I/O 3 | I/O 2 | I/O 1 | I/O 0 |
|---|---|---|---|---|---|---|---|
| 0 | 0 | P1024 | P1024' | P512 | P512' | P256 | P256' |
| P128 | P128' | P64 | P64 | P32 | P32' | P16 | P16' |
| P8 | P8' | P4 | P4' | P2 | P2' | P1 | P1' |

Figure 2:
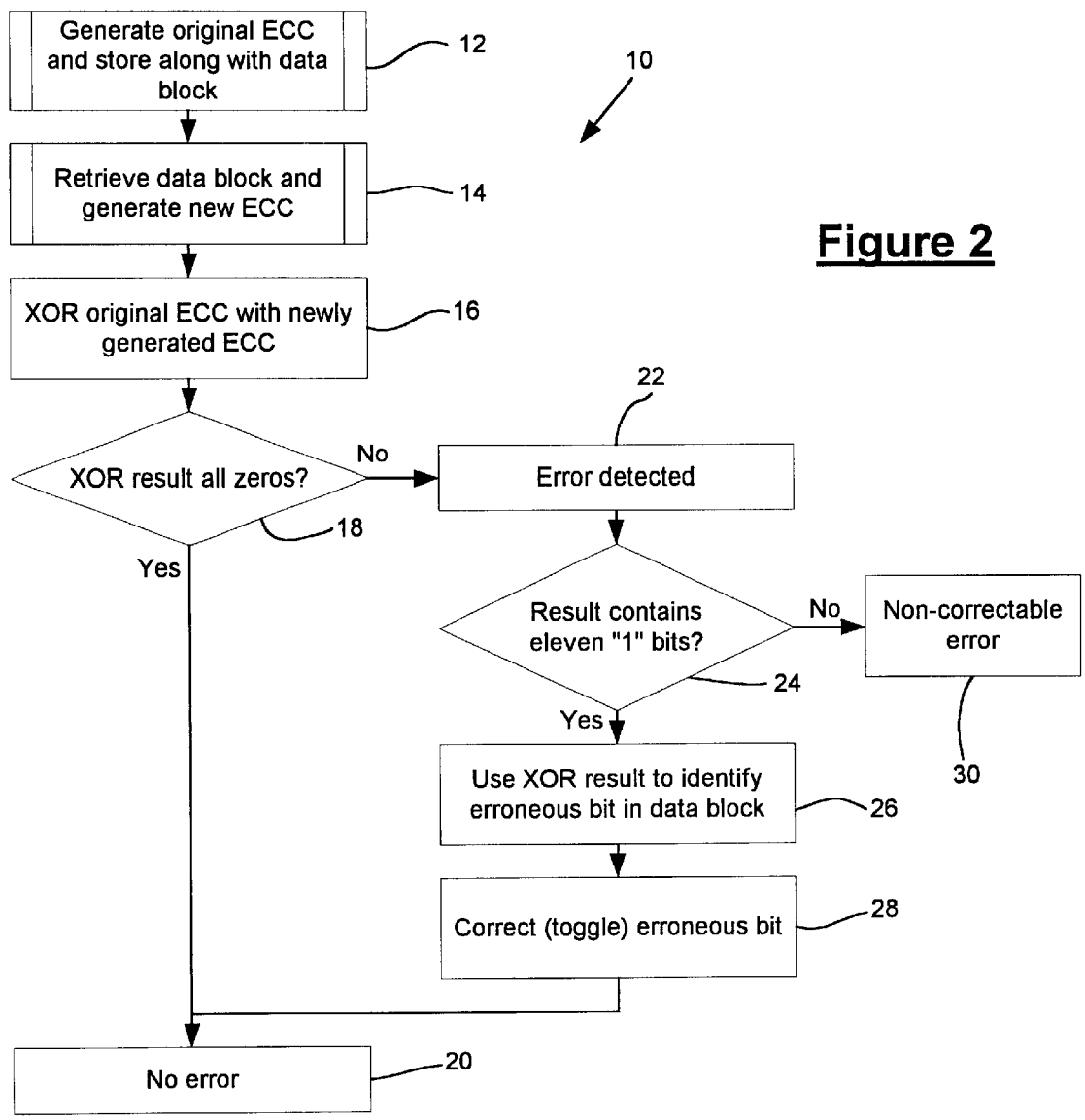
FIG. 2 is a flow chart diagram showing the general steps involved in use of an error correction code.
Figure 3:
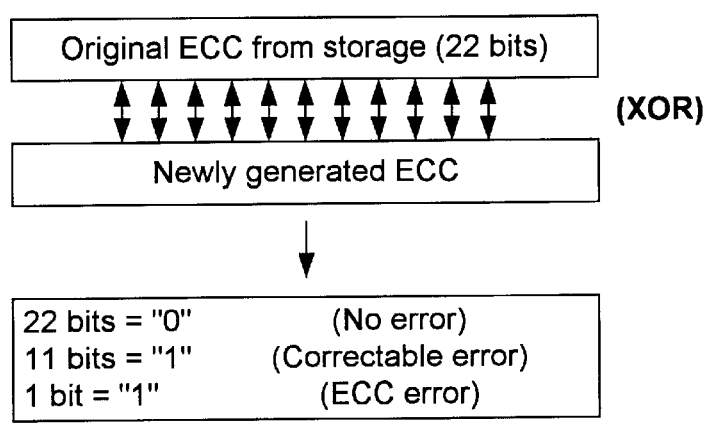
FIG. 3 is a block diagram illustrating comparison of first and second ECCs to determine error occurrence.

FIG. 2 is a flow chart diagram of the general procedure 10 used for error checking using the ECC during a data storage and retrieval process. Beginning at 12 in procedure 10, an error correction code (ECC) is generated from a data block prior to storage. The data block in this case comprises 256 bytes, and the ECC is three bytes in length of which 22 bits are used as explained above. The ECC is formed from parity bits generated from the rows and columns of the data block as illustrated in FIG. 1. For example, ECC bit P8 is generated from the parity of the bits from all of the even numbered rows in the data block, and ECC bit P1 is generated from the parity of the bits from all of the odd numbered columns.

The ECC code for the data block is first generated before the data is written to the storage medium (12) and the generated code is stored along with the data block. When the data block is retrieved from the storage medium again, a new ECC code is generated at 14. Then, an exclusive-OR (XOR) operation is performed using the original code and the newly generated code (16), producing a comparison result. The comparison procedure at 16 is illustrated diagrammatically in FIG. 3.

The comparison result from the XOR operation indicates whether an error has occurred, and to some extent the type of error which has occurred in that event. If the comparison result is all zeros at 18, then no error is present in the retrieved data block and the procedure continues to 20 where the data is available for use. Any other result means that an error has occurred, and the procedure continues to 22.

At 24 the comparison result is tested to determine if it contains eleven "1" bits (i.e. half of the total of 22 operative bits in the result). This indicates that a correctable single bit error has occurred. In that case the procedure continues to 26, otherwise the procedure terminates at 30 having flagged a non-correctable error.

If a correctable, single bit error is indicated (24) then the XOR result can also be used to identify the particular bit in the data block that is erroneous (26). The bits of the comparison result contain the erroneous bit address, as will be apparent from the structure of the ECC as illustrated in FIG. 1. The erroneous bit offset address is given by:

(P1024, P512, P256, P128, P64, P32, P16, P8, P4, P2, P1)

The bits P1024 to P8 give the row address whilst bits P4, P2, P1 identify the bit within the selected row (byte). Once the failed bit has been identified it is simply a matter of toggling that bit to correct it. This is carried out at 28, and the procedure then returns to 20 where the data of the corrected data block is ready for use.

Improved Error Correction Code Generation

The present invention in the preferred embodiment described herein provides an improved method for generating error correction codes for data blocks. Once the ECC has been generated, the code comparison and error correction procedure is generally the same as that described above, as will become apparent from the following description.

In the preferred embodiment of the present invention a 24-bit error correction code (ECC) is generated for a 512-byte data block. The 24-bit (3-byte) ECC allows for correction of any single bit error in the data block.

The basic idea of the preferred ECC generation method involves arranging all the bits of the data block into a bit array having a plurality of rows with each row containing 8 bits. The parity of each row and the parity of each column of the bit array is taken. Then, when a single bit error occurs, 1 row parity and 1 column parity will mismatch. The row and column of the parity mismatch points to the bad bit, which can then be toggled in order to correct the error.

The row and column parities are grouped by their binary address. We assign each bit an address of the form $a_{11}$-$a_0$, where $a_2$-$a_0$ are the bit offset within each byte and $a_{11}$-$a_3$ are the byte offset. All bits with an address that contains a "1" in bit $a_{11}$ are summed up to get the ECC parity bit $A_{11}$. All bits with address that contains a "0" in bit $a_{11}$ are summed up to get the parity bit $A_{11}'$. Doing this for all of the bit array address bits gives us a 24-bit ECC of the following form:

$$A_{11}A_{11}'A_{10}A_{10}'A_9A_9'A_8A_8'A_7A_7'A_6A_6'A_5A_5'A_4A_4'A_3A_3'A_2A_2'A_1A_1'A_0A_0'$$

Due to the binary nature of the way the rows and columns are arranged, each bit in the data block contributes to exactly half of the row parity ECC bits and half of the column parity ECC bits. For example, bit 1 of byte 0 of the bit array belongs to rows $A_{11}'A_{10}'A_9'A_8'A_7'A_6'A_5'A_4'A_3'$ and columns $A_2'A_1'A_0'$ of the ECC.

When a single bit error occurs, then exactly 12 of the bits in the 24-bit ECC will mismatch between the original ECC and the subsequently generated (post-error) ECC. This is the indication of the occurrence of a correctable, single bit error. If more than 12 or less than 12 bits mismatch, then some other form of error has occurred which is not correctable. Of course if there is no mismatch in ECC codes then there has been no error.

The particular bits of the ECC that do not match provide the bit address of the erroneous bit. Using the same example as above, if the comparison of ECC codes reveals that bits $A_{11}'A_{10}'A_9'A_8'A_7'A_6'A_5'A_4'A_3'$ mismatch and ECC bits $A_2'A_1'A_0'$ mismatch, this indicates that the erroneous bit is bit #1 of byte #0 in the bit array representation of the data block.

Figure 4:
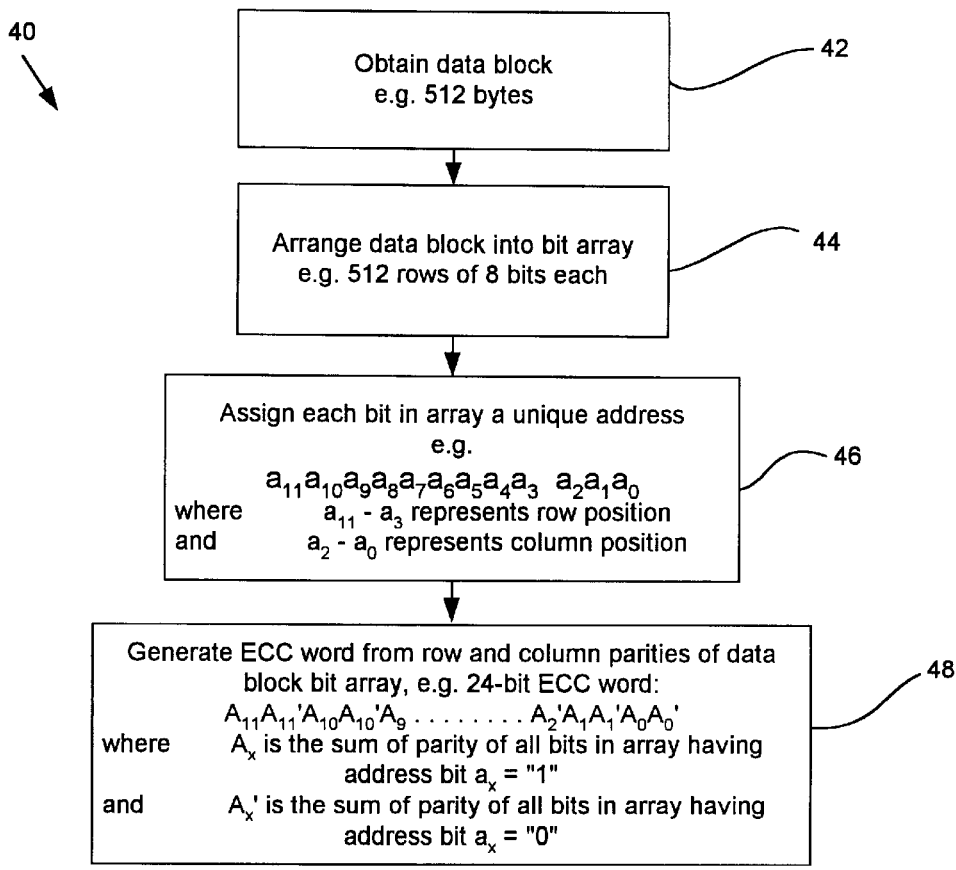
FIG. 4 is a flow chart diagram of a general method for an error correction code generation scheme of the preferred embodiment of the present invention.

The general method of the error correction code generation scheme of the preferred embodiment of the present invention is illustrated in flow diagram form in flow chart 40 shown in FIG. 4 of the accompanying drawings. As shown, the data block (e.g. 512 bytes) is first obtained (step 42) and arranged into a bit array of 512 rows with 8 bits in each row (step 44). Each bit in the bit array is assigned a unique address (step 46), for example of the form $a_{11}a_{10}a_9a_8a_7a_6a_5a_4a_3a_2a_1a_0$, where address bits $a_{11}$ to $a_3$ address the 512 rows of the bit array and $a_2$ to $a_0$ address the particular bit within the row. Then the 24-bit error correction code word is generated (step 48), where the ECC takes the form:

$$A_{11}A_{11}'A_{10}A_{10}'A_9A_9'A_8A_8'A_7A_7'A_6A_6'A_5A_5'A_4A_4'A_3A_3'A_2A_2'A_1A_1'A_0A_0'$$

In the ECC word, each bit $A_x$ (for x=0 to 11) is the parity sum of all bits in the bit array having the address bit $a_x$="1". Conversely, each bit $A_x'$ (for x=0 to 11) is the parity sum of all bits in the bit array having the address of bit $a_x$="0".

Optimized Error Correction Code Generation

Calculating the 24-bit ECC by ordinary computational methods operating on the entire data block would be computationally expensive, and could take an undesirable length of time. Accordingly, the preferred embodiment of the present invention employs the use of three lookup tables through which the ECC generation process can be considerably shortened. Advantageously, the use of the lookup tables allows the 24-bit ECC to be generated using one byte at a time from the data block, updating the ECC after each byte with a minimum of processing cycles.

Consider, in the following example, the correspondence between the bits of a given byte and the error correction code bits. Looking at byte #0 in the data block, for example, yields the following row and column ECC bit assignments for each bit:

TABLE 3

|       | $A_{11}/A_{11}'$ | $A_{10}/A_{10}'$ | $A_9/A_9'$ | ... | $A_2/A_2'$ | $A_1/A_1'$ | $A_0/A_0'$ |
|-------|------|------|------|-----|------|------|------|
| Bit 0 | 0/1 | 0/1 | 0/1 |     | 0/1 | 0/1 | 0/1 |
| Bit 1 | 0/1 | 0/1 | 0/1 |     | 0/1 | 0/1 | 1/0 |
| Bit 2 | 0/1 | 0/1 | 0/1 |     | 0/1 | 1/0 | 0/1 |
| Bit 3 | 0/1 | 0/1 | 0/1 | ... | 0/1 | 1/0 | 1/0 |
| Bit 4 | 0/1 | 0/1 | 0/1 |     | 1/0 | 0/1 | 0/1 |
| Bit 5 | 0/1 | 0/1 | 0/1 |     | 1/0 | 0/1 | 1/0 |
| Bit 6 | 0/1 | 0/1 | 0/1 |     | 1/0 | 1/0 | 0/1 |
| Bit 7 | 0/1 | 0/1 | 0/1 |     | 1/0 | 1/0 | 1/0 |

It can be seen from Table 3 above that every bit in the byte belongs to the same set of row parity bits. Extrapolating from that basis, if the byte contains an even number of "1" bits, then each of the corresponding row parity bits will be unaffected. If, on the other hand, the byte contains an odd number of "1" bits, then the corresponding ECC row parity bits will all be toggled (1's changed to 0's, 0's changed to 1's). Therefore, from a knowledge of the number of "1" bits in a given bit array row, and knowledge of which ECC parity bits are affected by that row, the effect of the particular row on the ECC can be determined.

For the case of a row containing an odd number of "1" bits, the ECC can be updated by XOR'ing the current parity ECC bits with a mask word corresponding to the ECC parity bits affected by that row. For the example based on the first row of the bit array (byte #0) the ECC mask is represented by [01 01 01 01 01 01 01 01 01 00 00 00]. It should be noted that this mask value affects the row parity bits only, and thus the last six bits, corresponding to the column parity bits, are always "0".

Two lookup tables are used to perform this portion of the ECC generation. A first lookup table provides a correspondence between a given byte value and the number of "1" bits in the binary representation thereof, or at least whether there are an odd or even number of "1" bits. A second lookup table provides an ECC row mask for every row address from 0 to 511. The first and second lookup tables can be calculated before they are needed, and so do not contribute to the computational time/load when generating the ECC. The first and second lookup tables will be valid for any data block bit array having the same row and column dimensions.

The next thing to notice is that for every possible byte value it is possible to determine the ECC parity bits A2 A2' A1 A1' A0 A0' that correspond to that byte. Accordingly, a third lookup table is generated recording a correspondence between each possible byte value and the ECC column parity bits. The third lookup table contains mask words which are addressed using the byte values from the data block. The mask word for the data block byte being processed is retrieved from the third lookup table and then XOR'ed with the low 6 bits of the current ECC to update all the ECC column parity bits at once for the byte.

By way of example, suppose the byte from the data block under consideration has the value 0=4A (01001010). The $A_0'$ ECC bit is the sum of all the bits in the byte that have a bit address with "0" in $a_0$. This would be bits 0, 2, 4, & 6 in this example. Summing these bits (0 +0 +0 +1) gives results in "1". Likewise, summing the other ECC column parity bits and treating odd sums as "1" and even sums as "0" gives the mask word:

A2 A2' A1 A1' A0 A0'=1 0 0 1 0 1

The optimized ECC generation algorithm of the preferred embodiment can be summarized as follows.

---

Clear current ECC value to all 0's
For each byte in the page do
{
    Count the number of 1 bits in the byte using lookup table
    PrvBitCount
    if there are an odd number of bits in the byte then
    {
        Lookup the ECC row address mask from the byte address
        using the PrvByteAddrParityMask lookup table
        XOR the row address mask into the current ECC value
    }
    Lookup the ECC column parity of the byte using lookup table
    PrvA2ToA0Parity.
    XOR the 6 column parity bits into the low 6 bits of the
    current ECC value
}

---

Figure 5:
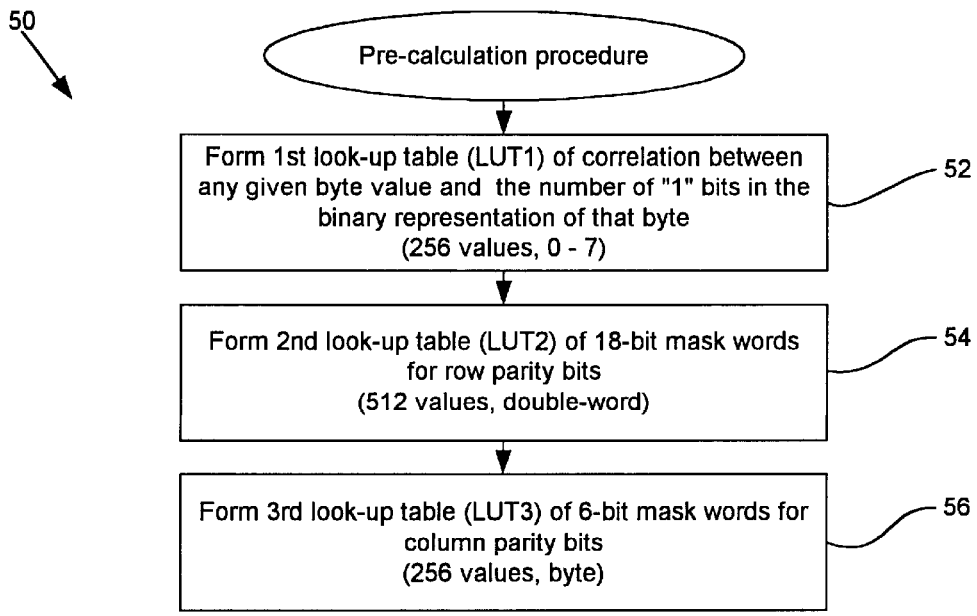
FIG. 5 is a general flow chart diagram illustrating a procedure of pre-calculations that can be used in the preferred embodiment of the present invention.

In this algorithm, the first lookup table is referred to as PrvBitCount, the second lookup table is referred to as PrvByteAddrParityMask and the third lookup table is referred to as PrvA2ToA0Parity. FIG. 5 is a general flowchart diagram illustrating the procedure 50 of pre-calculations which can be used in the preferred embodiment of the present invention, which facilitates fast ECC processing when writing and/or reading data blocks. The pre-calculation procedure forms a first lookup table (also referred to herein as LUT1 and PrvBitCount) at 52, which represents a correlation between a given byte value and the number of "1" bits in the binary representation of the byte. At 54 a second lookup table (also referred to as LUT2 and PrvByteAddrParityMask) is formed, representing a set of mask words of ECC parity bits which are affected by each given data block row. Finally the procedure 50 involves formation of a third lookup table (also referred to as LUT3 and PrvA2ToA0Parity) which represents a set of mask words codifying the correlation between a given byte value and the six ECC column parity bits $A_2$, $A_2'$, $A_1$, $A_1'$, $A_0$ and $A_0'$. This is performed at 56.

The procedure 50 can be implemented to generate these lookup tables using a computer program referred to as FlashDrvrTableGen.cpp which is reproduced below in the C++ programming language.

```
/******************************************************************
*
* PROGRAM:
*        FlashDrvrTableGen.cpp
*
* DESCRIPTION:
*        This file gets compiled into a stdio application and generates
*        the lookup tables used by the FlashDrvr.c module.
*
*
******************************************************************/
#include <stdio.h>
#include <stdlib.h>
int
main (int argc, char* argv[])
{
    long             j;
    unsigned long    byte, addr;
    unsigned long    bits;
    unsigned long    mask;
    printf ("\nFlash Driver Lookup Table Generator\n");
    // ========================================================================
    // Generate the table that maps a byte into the # of bits
    // Lookup table PrvBitCount
    // ========================================================================
    printf ("\n//----------------------------------------------------------");
    printf ("\n// This table maps a byte value into the number of bits in the
            byte");
    printf ("\n// It is automatically generated by the FlashDrvrTableGen.cpp"
            "\n// program. ");
    printf ("\n//----------------------------------------------------------");
    printf ("\nstatic const Byte PrvBitCount[] = "
            "\n    {");
    for (byte=0; byte<256; byte++)
        {
        // Count the bits
        bits = 0;
        for (j=0; j < 8; j++)
            {
            mask = 1 << j;
            if (byte & mask)
                bits++;
            }
        // New line every 8 bytes
        if ((byte % 8) == 0)
            printf ("\n\t");
        printf ("%d", bits);
        if (byte < 255)
            printf (", ");
        }
    printf ("\n    };\n\n");
    // ========================================================================
    // Generate the table that maps a byte into the A2, A2', A1, A1', A0, A0'
    // parity bits
    // Lookup table PrvA2toA0Parity
    // ========================================================================
    printf ("\n//----------------------------------------------------------");
    printf ("\n// This table maps a byte value into the A2 A2' A1 A1' A0 A0' ");
    printf ("\n// parity bits");
    printf ("\n// It is automatically generated by the FlashDrvrTableGen.cpp"
            "\n// program. ");
    printf ("\n//----------------------------------------------------------");
    printf ("\nstatic const Byte PrvA2ToA0Parity[] = "
            "\n    {");
    for (byte=0; byte<256; byte++)
        {
        unsigned long    parity = 0;
        // Figure out A2. This is the parity of bits 7,6,5,4
        if (byte & 0x80)
            parity ^= 0x20;
        if (byte & 0x40)
            parity ^= 0x20;
        if (byte & 0x20)
            parity ^= 0x20;
        if (byte & 0x10)
            parity ^= 0x20;
        // Figure out A2'. This is the parity of bits 3,2,1,0
        if (byte & 0x08)
            parity ^= 0x10;
```

```
                if (byte & 0x04)
                    parity ^= 0x10;
                if (byte & 0x02)
                    parity ^= 0x10;
                if (byte & 0x01)
                    parity ^= 0x10;
                // Figure out A1. This is the parity of bits 7,6,3,2
                if (byte & 0x80)
                    parity ^= 0x08;
                if (byte & 0x40)
                    parity ^= 0x08;
                if (byte & 0x08)
                    parity ^= 0x08;
                if (byte & 0x04)
                    parity ^= 0x08,
                // Figure out A1'. This is the parity of bits 5,4,1,0
                if (byte & 0x20)
                    parity ^= 0x04;
                if (byte & 0x10)
                    parity ^= 0x04;
                if (byte & 0x02)
                    parity ^= 0x04;
                if (byte & 0x01)
                    parity ^= 0x04;
                // Figure out A0. This is the parity of bits 7,5,3,1
                if (byte & 0x80)
                    parity ^= 0x02;
                if (byte & 0x20)
                    parity ^= 0x02;
                if (byte & 0x08)
                    parity ^= 0x02;
                if (byte & 0x02)
                    parity ^= 0x02;
                // Figure out A0'. This is the parity of bits 6,4,2,0
                if (byte & 0x40)
                    parity ^= 0x01;
                if (byte & 0x10)
                    parity ^= 0x01;
                if (byte & 0x04)
                    parity ^= 0x01;
                if (byte & 0x01)
                    parity ^= 0x01;
                // New line every 8 bytes
                if ((byte % 8) == 0)
                    printf ("\n\t");
                printf ("0x%02X", parity);
                if (byte < 255)
                    printf (", ");
            }
    printf ("\n    };\n\n");
// ========================================================================
// Generate the table that maps a byte address from 0 to 512 into
// a DWord mask of the address bits in this form:
// A11A11'A10A10'A9A9'A8A8'A7A7'A6A6'A5A5'A4A4'A3A3'000000
// Lookup table PrvByteAddrParityMask
// ========================================================================
    printf ("\n//----------------------------------------------------------");
    printf ("\n// This table maps a byte address from 0 to 512 into the bit
            address mask:");
    printf ("\n// A11 A11' A10 A10' A9 A9' A8 A8' A7 A7' A6 A6' A5 A5' A4 A4' A3
            A3' 0 0 0 0 0 0");
    printf ("\n// It is automatically generated by the FlashDrvrTableGen.cpp"
            "\n// program. ");
    printf ("\n//----------------------------------------------------------");
    printf ("\nstatic const DWord PrvByteAddrParityMask[] = "
            "\n    {");
    for (addr=0; addr < 0x200; addr++)
        {
            unsigned long   mask = 0;
            long            bit;
            // Create the mask
            for (bit = 11; bit >= 3; bit--)
                {
                    if (addr & (1 << (bit - 3)))
                        mask |= 1 << (2*bit+1);
                    else
                        mask |= 1 << (2*bit);
                }
```

```
            // New line every 8 entries
            if ((addr % 8) == 0)
                printf ("\n\t");
            printf ("0x%08X", mask);
            if (addr < 511)
                printf (", ");
        }
    printf ("\n    };\n\n");
    return 0;
}
```

In the interests of brevity the actual tables are not reproduced herein, but those of ordinary skill in the art may easily generate tables appropriate for a 512 byte data block arranged in a bit array of 512 rows of 8 bits each, using the above program.

Figure 6:
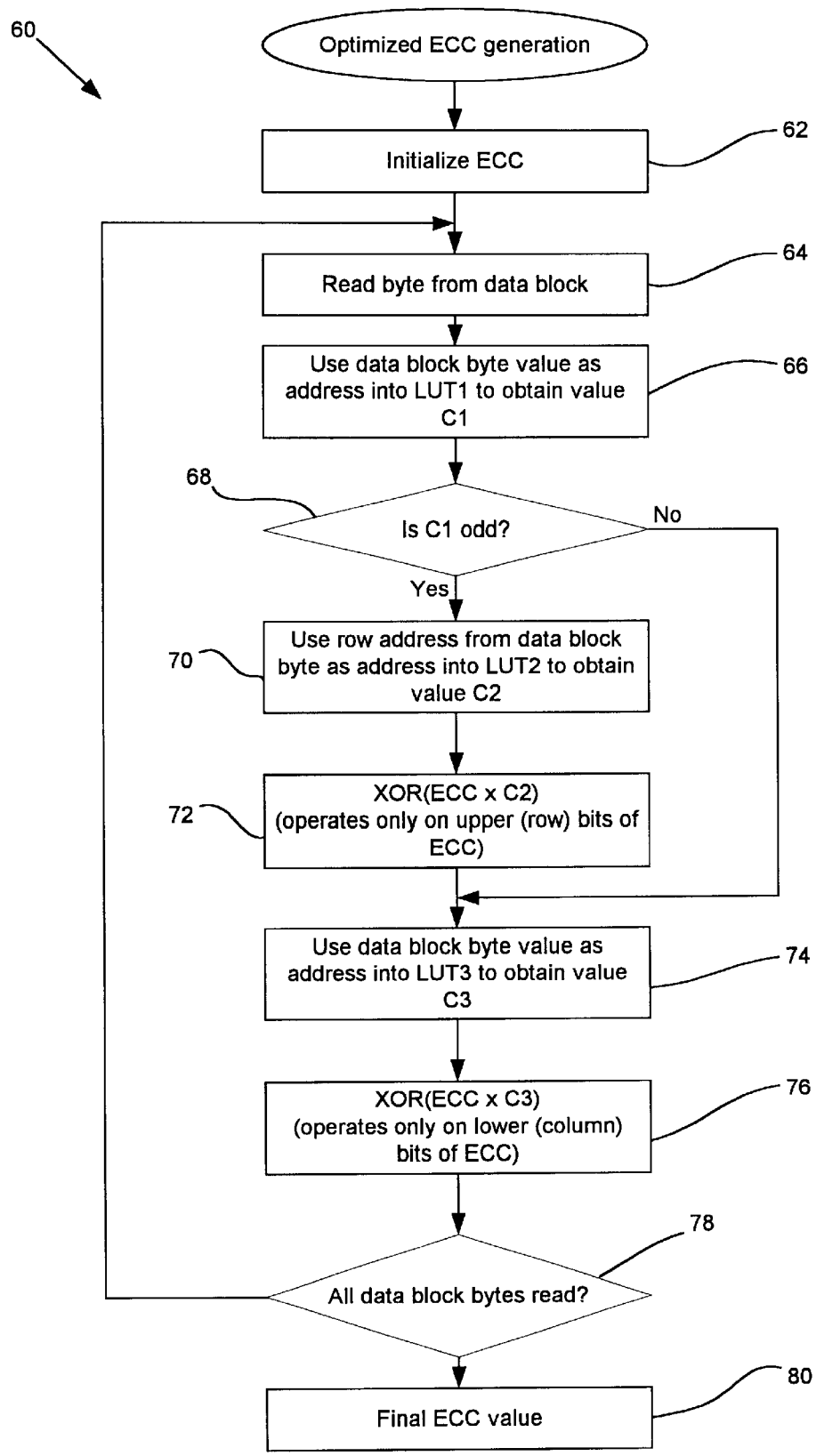
FIG. 6 is a flowchart diagram of a procedure that can be used to generate an error correction code according to the preferred embodiment of the present invention.

FIG. 6 of the accompanying drawings is a flowchart diagram of a procedure 60 that can be used to generate an error correction code according to the preferred embodiment of the present invention. The ECC generation procedure 60 is suitable for use with a 512 byte data block and the lookup tables described hereinabove. The data block can be supplied to the ECC generation procedure in a serial manner, one byte at a time.

At 62 of ECC generation procedure 60, the ECC is initialized for the data block to be processed, by setting the initial ECC value to zero. A loop begins at 64, reading the data block one byte at a time. The data block byte is then used at 66 as an address into the lookup table LUT1 (PrvBitCount) to retrieve corresponding value C1 from the lookup table. The value C1 is tested at 68 to determine whether it represents an odd number or an even number of "1" bits in the data block byte. If it is an even number the procedure is directed to 74, otherwise the procedure continues on to 70.

If the data block byte contains an odd number of "1" bits, the row address of the data block byte is used as an address into the lookup table LUT2 (PrvByteAddrParityMask) at 70, to obtain the corresponding row parity mask word C2. The current value of the ECC and the mask word C2 are then used as operands in an XOR operation (72) to update the ECC with the row parity influences of the data block byte.

At 74 of the ECC generation procedure, the data block byte value is used as an address into the third lookup table LUT3 (PrvA2ToA0Parity). A corresponding column parity mask word C3 is retrieved from the lookup table. The current value of the ECC and the mask word C3 are then used as operands in an XOR operation (76) to update the ECC with the column parity influences of the data block byte.

The data block is tested to determine if all of the data bytes have been read therefrom at 78. If all of the data has been read then the final ECC is complete and available at 80. If not all of the data block has been processed then the procedure 60 returns to 64 for the next byte of the data block. The loop (64 to 78) continues until all of the data block bytes have been processed and accounted for in the final ECC value.

A C++ language computer program which implements the ECC generation procedure 60 is listed below. The program is referred to as FlashPrvECCCalc. Note that the parameter flashPrvPageSize refers to the data block size in bytes, and in the present example would be set to 512. The parameter flashPrvECCBytes refers to the resultant size of the ECC, and in this case is 3 bytes. The program FlashPrvECCCalc utilizes the lookup tables generated by the FlashDrvrTableGen program listed above.

```
/*************************************************************
 *     Function:     FlashPrvECCCalc
 *
 *     Summary:      Calculate the ECC value for a 512 byte page.
 *
 *     Parameters:
 *         pageBuf         IN          page buffer
 *         *eccBuf         OUT         ECC returned here
 *
 *     Returns:
 *         0 if no error. NOTE: returns 0 even if card not formatted,
 *         caller should check for a nil batH.
 *
 *     Called By:
 *         PrvPageReadRaw()
 *         PrvPageWrite()
 *
 *************************************************************/
Err
FlashPrvECCCalc (Byte pageBuf[flashPrvPageSize],
                              Byte eccBuf[flashPrvECCBytes])
{
    Word        addr;
    DWord       ecc;
    Byte        byte;
    BytePtr bP;
    // Init
    bP = pageBuf;
    ecc = 0;
    // -----------------------------------------------
    // Loop through each of the bytes in the page
    // -----------------------------------------------
    for (addr = 0; addr < flashPrvPageSize; addr++)
        {
            byte = *bP++;
            // Count the # of bits in this byte. If odd, we must
            // update the row ECC bits
            if (PrvBitCount[byte] & 0x01)
                {
                    // Lookup the ECC row address mask that corresponds to
                    // this byte offset and
                    // Update the ECC with these bits
                    ecc ^= PrvByteAddrParityMask[addr];
                }
            // XOR in the affect on the column parity bits
            ecc ^= PrvA2ToA0Parity[byte];
        }
    // -----------------------------------------------
    // Return the ECC into the byte array the caller passed us
    // -----------------------------------------------
    eccBuf[0] = ecc >> 16;
    eccBuf[1] = ecc >> 8;
    eccBuf[2] = ecc;
    return 0;
}
```

As mentioned previously, once the ECC has been formed according to the present invention it may be utilized in a generally conventional manner to detect and correct errors in the corresponding data block. For completeness, a C++ computer code listing of a program entitled FlashPrvEC-CCorrect is presented below. This program functions to compare "before" and "after" ECC values for a data block (page), determine whether an error is present in the data block and correct the error if it is a correctable single bit error.

```
/***************************************************************
*       Function:        FlashPrvECCCorrect
*
*       Summary:         Compare ECC values for a page and correct
*           any errors detected. If any bit errors are detected,
*           *eccValidP will be false on exit. If the page could not be
*           corrected, then flashErrDataErr will be returned. If
*
*       Parameters:
*           pageBuf      IN        page buffer
*           oldEcc       IN        original ECC stored with page
*           newEcc       IN        new ECC calculated on pageBuf[]
*           *eccValidP   OUT       returned true if no errors detected
*
*
*       Returns:
*           flashErrDataErr if uncorrectable error detected
*
*       Called By:
*           PrvPageRea()
*
****************************************************************/
Err
FlashPrvECCCorrect (Byte pageBuf[flashPrvPageSize],
            Byte oldECCBuf[flashPrvECCBytes], Byte
newECCBuf[flashPrvECCBytes],
            BooleanPtr eccValidP)
{
    Err err = 0;
    DWord    oldECC, newECC;
    DWord    eccErrs;
    Word     bitErrs;
    // -------------------------------------------------
    // XOR the two ECCs together
    // -------------------------------------------------
    oldECC = *((DWordPtr)oldECCBuf) >> 8;
    newECC = *((DWordPtr)newECCBuf) >> 8;
    eccErrs = oldECC ^ newECC;
    // if perfect match, exit
    if (!eccErrs)
        {
          *eccValidP = true;
          goto Exit;
        }
    else
        *eccValidP = false;
        // -------------------------------------------------
        // Count how many bit errors there were
        // -------------------------------------------------
        bitErrs = PrvBitCount [(eccErrs >> 16) & 0x00FF];
        bitErrs += PrvBitCount [(eccErrs >> 8) & 0x00FF];
        bitErrs += PrvBitCount [eccErrs & 0x00FF];
        // -------------------------------------------------
        // If exactly 12, we can fix it
        // -------------------------------------------------
        if (bitErrs != 12)
            err = flashErrDataErr;
        else
            {
              Word     bit;
              DWord    bitAddr = 0;
              // Create the bitAddr of the bad bit
              for (bit = 0; bit < 12; bit++)
                {
                   if   (eccErrs & (1L << (bit*2+1)))
                        bitAddr |= (1L << bit);
                }
              // Toggle the bad bit
              pageBuf[bitAddr >> 3] ^= (1 << (bitAddr & 0x07));
            }
}
```

Exit:
    ErrNonFatalDisplayIf (err, " ");
    return err;
}

The preceding algorithms embodying the present invention may be implemented in digital data processing hardware, such as in the interface circuitry used to store and retrieve data from a data storage device in the form of a disk drive, flash memory or the like. The processing algorithms can be hardwired in circuitry or implemented using general data processing apparatus operating under control of microcode, for example. The dedicated or general purpose data processing circuitry may include or be coupled to memory which is pre-stored with the lookup tables suitable for the data block dimensions to be used for error correction coding in the particular application. Alternatively, the lookup tables can be generated at will using the algorithms described herein.

The foregoing detailed description of the present invention has been presented by way of example only, and it is contemplated that changes and modifications may be made by one of ordinary skill in the art, to the specific methods and parameters described herein without departing from the scope of the invention. For example, whilst the preferred embodiment is described in terms of generating a 3-byte error correction code for a data block comprising 512 bytes arranged in 512 rows of one byte each, it will be recognized that other data block sizes and arrangements may equally be used, and may result in a different size error correction code, and still be within the scope of the present invention.

I claim:

1. A method for determining an error correction code for a block of digital data comprising a sequence of data units, the method comprising the steps of:
   a) initializing the error correction code; and
   b) for each said data unit in the sequence, performing first and second operations on the error correction code according to the value of the data unit and the sequence position of the data unit.

2. A method as claimed in claim 1 wherein, with the data block arranged as an array having rows and columns with each row comprising one data unit, a first portion of the error correction code corresponds to row parity values of the array and a second portion of the error correction code corresponds to column parity values of the array.

3. A method as claimed in claim 2 wherein, for a given data unit in the sequence, said first operation modifies the error correction code according to the sequence position of the given data unit.

4. A method as claimed in claim 3, wherein said first operation comprises determining whether the given data unit value has an odd or even parity and, according to the parity determination, modifying the error correction code using a first mask word determined according to the sequence position of the given data unit.

5. A method as claimed in claim 4, wherein the first mask word is obtained from a first predetermined lookup table using the sequence position of the given data unit.

6. A method as claimed in claim 5, wherein said second operation modifies the error correction code according to the value of the given data unit.

7. A method as claimed in claim 6, wherein said second operation comprises modifying the error correction code using a second mask word obtained from a second predetermined lookup table according to the value of the given data unit.

8. A method as claimed in claim 7, wherein the error correction code is modified by performing an exclusive-OR operation with said second mask word.

9. A method as claimed in claim 8, wherein said second mask word is structured so as to modify only said second portion of the error correction code.

10. A method as claimed in claim 4, wherein the error correction code is modified by performing an exclusive-OR operation with said first mask word.

11. A method as claimed in claim 10, wherein said first mask word is structured so as to modify only said first portion of the error correction code.

12. A method as claimed in claim 4, wherein the given data byte is determined to be of odd or even parity through a third predetermined lookup table using the given data byte value.

13. A method as claimed in claim 12, wherein the third predetermined lookup table comprises a pre-calculated correspondence between odd and even parity and each possible data unit value.

14. A method as claimed in claim 5, wherein the first predetermined lookup table comprises a pre-calculated correspondence between each sequence position in the data block sequence and the first portion of the error correction code.

15. A method as claimed in claim 7, wherein the second predetermined lookup table comprises a pre-calculated correspondence between each possible data unit value and the second portion of the error correction code.

16. A method as claimed in claim 1, wherein said first and second operations utilize first and second predetermined lookup tables.

17. A method as claimed in claim 16 wherein, with the data block arranged as an array having rows and columns with each row comprising one data unit and the row positions corresponding to the data block sequence positions, a first portion of the error correction code corresponds to row parity values of the array and a second portion of the error correction code corresponds to column parity values of the array.

18. A method as claimed in claim 17, wherein the first predetermined lookup table comprises a pre-calculated correspondence between each sequence or row position in the data block sequence and the first portion of the error correction code.

19. A method as claimed in claim 18, wherein the second predetermined lookup table comprises a pre-calculated correspondence between each possible data unit value and the second portion of the error correction code.

20. A method as claimed in claim 19 wherein, for a given data unit of the data block, the first operation comprises:
determining the parity of the given data unit; and
if the given data unit parity is of a first value, obtaining a first mask word from the first predetermined lookup table corresponding to the given data unit sequence position, and modifying the error correction code by performing an exclusive-OR operation with the first mask word.

21. A method as claimed in claim 20, wherein the second operation comprises obtaining a second mask word from the second predetermined lookup table, and modifying the error correction code by performing an exclusive-OR operation with the second mask word.

22. A method as claimed in claim 20, wherein the parity of the given data unit is determined by use of a third predetermined lookup table comprising a pre-calculated correspondence between odd and even parity and each possible data unit value.

23. An error correction code generator for generating an error correction code for a data block comprising a sequence of data units, the error correction code generator comprising:
a first stored lookup table having first mask words representing a correspondence between each possible data unit sequence position of the data block and bit modifications for the error correction code;
a second stored lookup table having second mask words representing a correspondence between each possible data unit value and bit modifications for the error correction code;
a data processor coupled to access the first and second lookup tables and coupled to receive the sequence of data units comprising the data block, wherein the data processor initializes the error correction code and, for each data unit in the data block sequence, modifies the error correction code utilizing the first and second lookup tables.

24. An error correction code generator as claimed in claim 23 wherein, for each data unit in the data block sequence, the data processor determines the parity of the data unit and, if the given data unit parity is of a first value, obtains a first mask word from the first stored lookup table corresponding to the given data unit sequence position, and modifies the error correction code by performing an exclusive-OR operation with the first mask word.

25. An error correction code generator as claimed in claim 24, including a third stored lookup table comprising a correspondence between parity values and each possible data unit value, the data processor being coupled to access the third stored lookup table, and wherein the data processor determines the parity of each data unit of the data block by consulting the third lookup table using the value of the data unit.

26. An error correction code generator as claimed in claim 24 wherein, for each data unit in the data block sequence, the data processor obtains a second mask word from the second stored lookup table, and modifies the error correction code by performing an exclusive-OR operation with the second mask word.

27. A method for generating an error correction code for a data block comprising a sequence of data units, the method comprising:
initializing the error correction code; and
for each data unit in the data block sequence:
performing a first modification to the error correction code utilizing a first stored lookup table having first mask words representing a correspondence between each possible data unit sequence position of the data block and bit modifications for the error correction code; and
performing a second modification to the error correction code utilizing a second stored lookup table having second mask words representing a correspondence between each possible data unit value and bit modifications for the error correction code.

28. A method as claimed in claim 27, wherein the first and second modifications of the error correction code comprise exclusive-OR operations between the error correction code and the first and second mask words, respectively.

29. A method for error correction of a data block comprising a sequence of data units, comprising:
generating a first error correction code according to the method as claimed in claim 27;
generating a second error correction code according to the method as claimed in claim 27;

comparing the first and second error correction codes using an exclusive-OR operation;

determining a number of bits mismatched in the comparison between the first and second error correction codes; and if a predetermined number of bits mismatch, toggling a bit of the data block on the basis of the mismatched bits of the error correction code comparison.

* * * * *